(12) United States Patent
Cheng et al.

(10) Patent No.: US 12,189,270 B2
(45) Date of Patent: Jan. 7, 2025

(54) Y-BRANCH TYPE PHASE-CHANGE ALL-OPTICAL BOOLEAN LOGIC DEVICE AND ALL-BINARY LOGIC IMPLEMENTATION METHOD THEREFOR

(71) Applicant: HUAZHONG UNIVERSITY OF SCIENCE AND TECHNOLOGY, Hubei (CN)

(72) Inventors: Xiaomin Cheng, Hubei (CN); Zhuli He, Hubei (CN); Yunlai Zhu, Hubei (CN); Han Li, Hubei (CN); Xiangshui Miao, Hubei (CN)

(73) Assignee: HUAZHONG UNIVERSITY OF SCIENCE AND TECHNOLOGY, Hubei (CN)

( * ) Notice: Subject to any disclaimer, the term of this patent is extended or adjusted under 35 U.S.C. 154(b) by 0 days.

(21) Appl. No.: 18/577,702

(22) PCT Filed: Sep. 7, 2021

(86) PCT No.: PCT/CN2021/116821
§ 371 (c)(1),
(2) Date: Jan. 9, 2024

(87) PCT Pub. No.: WO2023/284089
PCT Pub. Date: Jan. 19, 2023

(65) Prior Publication Data
US 2024/0319563 A1    Sep. 26, 2024

(30) Foreign Application Priority Data
Jul. 12, 2021    (CN) .......................... 202110786681.9

(51) Int. Cl.
*G02F 3/02*    (2006.01)
*G11C 13/00*    (2006.01)
*H03K 19/173*    (2006.01)

(52) U.S. Cl.
CPC .......... *G02F 3/022* (2013.01); *G11C 13/0004* (2013.01); *H03K 19/173* (2013.01)

(58) Field of Classification Search
CPC .... H03K 19/173; G11C 13/0004; G02F 3/022
See application file for complete search history.

(56) References Cited

U.S. PATENT DOCUMENTS

| | | | |
|---|---|---|---|
| 6,810,407 B1 * | 10/2004 | Jaques | G02F 3/00 708/801 |
| 2004/0184750 A1 * | 9/2004 | Shahar | G02F 1/225 385/122 |
| 2010/0039848 A1 * | 2/2010 | Meijer | G02F 1/011 365/114 |

(Continued)

FOREIGN PATENT DOCUMENTS

| | | |
|---|---|---|
| CN | 109814319 | 5/2019 |
| CN | 110262090 | 9/2019 |

(Continued)

OTHER PUBLICATIONS

Wang et al., Overview of Phase-Change Materials Based Photonic Devices, IEEE Access, vol. 8 (Year: 2020).*

(Continued)

*Primary Examiner* — Charlie Y Peng
(74) *Attorney, Agent, or Firm* — JCIPRNET

(57) ABSTRACT

A Y-branch type phase-change all-optical Boolean logic device comprises a waveguide of a Y-branch structure and phase change function units covered over the waveguide. In the logic implementation method, a light pulse having a large power is employed to perform a write operation on the phase change function unit, so that the phase change function unit is heated to generate a crystallization or amorphization phase change, thereby causing a difference in optical properties under two states; the state of the phase change function unit is read by employing a light pulse having a small power, and the state of its phase change material is not changed. By defining input logic signals respectively and (Continued)

defining three operation steps, an operation mode reconfigurable logic can be implemented, and all 16 binary Boolean logic calculations are implemented in a simple structure by means of step-by-step operation.

9 Claims, 6 Drawing Sheets

(56) References Cited

U.S. PATENT DOCUMENTS

| | | |
|---|---|---|
| 2010/0097677 A1 | 4/2010 | Nazarathy et al. |
| 2014/0169790 A1* | 6/2014 | McGlashan-Powell ............... G02F 1/09 398/45 |
| 2020/0081318 A1 | 3/2020 | Rios et al. |

FOREIGN PATENT DOCUMENTS

| | | | |
|---|---|---|---|
| CN | 111684343 | 9/2020 | |
| CN | 112180653 | 1/2021 | |
| EP | 1174759 A1 * | 1/2002 | ........... G02F 1/3517 |
| KR | 20130085329 | 7/2013 | |

OTHER PUBLICATIONS

"International Search Report (Form PCT/ISA/210) of PCT/CN2021/116821", mailed on Apr. 13, 2022, with English translation thereof, pp. 1-4.

"Written Opinion of the International Searching Authority (Form PCT/ISA/237) of PCT/CN2021/116821", mailed on Apr. 13, 2022, with English translation thereof, pp. 1-5.

\* cited by examiner

Y-BRANCH TYPE PHASE-CHANGE ALL-OPTICAL BOOLEAN LOGIC DEVICE AND ALL-BINARY LOGIC IMPLEMENTATION METHOD THEREFOR

CROSS-REFERENCE TO RELATED APPLICATION

This application is a 371 of international application of PCT application serial no. PCT/CN2021/116821, filed on Sep. 7, 2021, which claims the priority benefit of China application no. 202110786681.9, filed on Jul. 12, 2021. The entirety of each of the above-mentioned patent applications is hereby incorporated by reference herein and made a part of this specification.

TECHNICAL FIELD

The disclosure belongs to cross-technical fields pertaining to optics, microelectronics and logic operations, and more specifically, relates to a Y-branch phase-change all-optical Boolean logic device and an all-binary logic implementation method therefor.

DESCRIPTION OF RELATED ART

Through the disclosure of computers, emergence of Internet, popularization of smartphones and rise of Internet of Things, the development of information technology has fundamentally changed the way people live, manufacture things and carry out communication. While information technology brings conveniences to people, there is also an explosive growth of data, and therefore higher demands are imposed on data storage and computing technology. After decades of vigorous development, semiconductor technology as the foundation for information society has been developed to reach its physical limit. As Moore's Law is about to reach the ultimate limit, next-generation storage and computing technology has now become a popular research top for industry and academia. In-memory computing technology, which directly employs memory to perform computing operations, is considered to be one of the most promising solutions to overcome the bottleneck of today's computing technology.

Research on logic computing devices based on new non-volatile memories such as memristors and phase-change memories is the basis of in-memory computing. For example, phase-change memory may be reversibly transformed between a crystalline state or an amorphous state with different inputs of electrical pulses. Logic "0" and "1" are characterized through the significant difference between two phase states. Moreover, after external input is withdrawn, the physical state may be maintained and the storage of information is non-volatile. The reconfigurable computing technology that has emerged in response to the development of semiconductors is able to realize spatial mapping from algorithms to computing engines, and is compatible with basic driving method of processor and high-performance computing. The fundamental concept is to emphasize reuse of resources. Currently, a variety of electrical Boolean logic calculations have been implemented by combining the reconfigurable concept with the non-volatility of memristors.

However, the bandwidth of electronic devices hinders the electronic technology from developing to a high level. Compared with electrical devices, optical devices have the advantages of fast speed, large bandwidth, parallel operation (wavelength division multiplexing), and insensitivity to electromagnetic interference. At present, data processing and storage are mainly realized through electrical devices. The transmission and processing of Internet data require implementation of an optical-electrical-optical conversion process, which not only limits the operating speed of the system, but also generates a large amount of power consumption, and therefore the development of information technology is badly restricted. If data storage and processing are carried out through optical methods, that is, all-optical signal processing, the optical-electrical-optical conversion process may be avoided, and low-power, high-speed, high-bandwidth, high-reliability, and large-capacity all-optical information technology will able to be achieved.

Optical methods are one of the optimal solutions to break through the bottleneck of Moore's Law in the future, and have the advantages of high speed and high bandwidth. In recent years, optical storage based on phase-change materials has received widespread attention due to its non-volatility. Phase-change materials have two stable states: a crystalline state and an amorphous state. In these two states, phase-change materials exhibit significant differences in electrical and optical properties, and are able to achieve reversible transformation between the two states under the effects of electricity, heat, and light, thus having high repeatability and stability. Currently, the research on phase-change optical logic is in the early stage. Although there are some precedents of employing phase-change materials to realize optical logic functions, some electrical devices are involved in the implementation process, so the processes are not entirely all-optical logic, and output thereof also belongs to electrical logic signal which cannot be cascaded in the full optical path; therefore, defects exist in the combination of devices to achieve complex logic functions. Moreover, in the structure of one device, only two to three binary Boolean logics may be implemented, and there is room for development of the integration level. Some research works have demonstrated the use of a single phase-change unit makes it possible to implement some binary optical Boolean logic operations. However, it is still not possible to implement all of binary all-optical Boolean logic operations in a single device; under the circumstances, the development of performing phase-change optical logic in practice is hindered significantly.

SUMMARY

In view of the shortcomings of the existing technology, the purpose of the present disclosure is to provide a Y-branch phase-change all-optical Boolean logic device and an all-binary logic implementation method therefor, aiming to solve the problem that it is still impossible to realize all of binary all-optical Boolean logic operations in a single device, and the circumstances have considerably hindered the development of performing phase-change optical logic in practice.

In order to achieve the above purpose, in the first aspect, the present disclosure provides a Y-branch phase-change all-optical Boolean logic device, which includes: a Y-branch waveguide and two phase-change function units;

each of two Y branches of the Y-branch waveguide has two protruding ridges; the two phase-change function units respectively cover the protruding ridges of the two Y branches; based on an evanescent wave coupling effect, when an optical pulse signal having a high power is input into the Y-branch waveguide, the phase-change function unit will absorb part of the optical power and produce a crystallization or amorphization phase change to realize the write operation; reading of the crystallization state of the phase-change function unit is achieved through different transmittances that the phase-change function unit has for the detection optical signal in the crystalline state or the amorphous state;

through write and read operations on the phase-change function unit, the Y-branch phase-change all-optical Boolean logic device is able to realize all 16 binary Boolean logic calculation functions.

It should be noted that the optical pulse signal having a high power mentioned in the above paragraph refers to an optical pulse signal that is able to cause the phase-change function unit to generate a crystallization or amorphization phase change.

In an optional example, the material of the phase-change function unit is a chalcogenide compound that is able to generate a reversible crystallization or amorphization phase change under different light pulses.

In an optional example, the real part of the complex refractive index of the phase-change function unit is greater than the real part of the complex refractive index of the Y-branch waveguide, so that part of the light propagating in the Y-branch waveguide enters the phase-change function unit to propagate, and then is merged into the Y-branch waveguide to continue propagating; the imaginary part of the complex refractive index of the phase-change function unit is not 0, so that the phase-change function unit absorbs the light propagated thereby.

The 16 binary Boolean logic operations include: TRUE operation, FALSE operation, P operation, Q operation, NOT P operation, NOT Q operation, P AND Q operation, P NAND Q operation, P OR Q operation, P NOR Q operation, P IMP Q operation, P NIMP Q operation, P RIMP Q operation, P RIMP Q operation, P XOR Q operation, and P XNOR Q operation.

In an optional example, an optical pulse signal is input to the Y branch side where the phase-change function unit is located. The phase-change function unit is heated by the optical power absorbed thereby, which may cause crystallization or amorphization phase change so that the phase-change function unit is finally in the crystalline state or the amorphous state, such that a write operation is performed on the phase-change function unit.

In an optional example, a detection signal is input to each of the two Y branches of the Y-branch waveguide, and the transmittances of the two phase-change function units are determined by detecting the intensity of the output optical signal and comparing the intensity of the output optical signal with the intensity of the input detection signal, so as to perform read operation on the phase-change function unit. The detection signal is a light pulse or continuous light with low power that does not change the state of the phase-change function unit.

In an optional example, each phase-change function unit includes: a phase-change function unit layer and a protective layer disposed from the bottom to the top; the protective layer is disposed to prevent the phase-change function unit from being oxidized.

In an optional example, the real part of the complex refractive index of the phase-change function unit is greater than the real part of the complex refractive index of the Y-branch waveguide and the imaginary part of the complex refractive index of the phase-change function unit is not 0. The complex refractive index mentioned in the above description refers to the complex refractive index of the phase-change function unit and the Y-branch waveguide at two signal wavelengths, namely the optical pulse signal and the detection signal.

In an optional example, the optical pulse signal is one of a first optical pulse signal or a second optical pulse signal; the first optical pulse signal is an optical signal that may cause the phase-change function unit to be partially crystallized from an amorphous state or cause the phase-change function unit to be amorphous from a partially crystallized state; the second optical pulse signal is an optical signal that may keep the phase-change function unit in the amorphous state from the amorphous state or cause the phase-change function unit to be amorphous from a partially crystallized state.

In a possible embodiment, each phase-change function unit includes: a GST phase-change function unit layer and an indium tin oxide (ITO) protective layer disposed from the bottom to the top; the material of the GST phase-change function unit layer is $Ge_2Sb_2Te_5$.

It can be understood that in the embodiments of the present disclosure, $Ge_2Sb_2Te_5$ is used as an example of a chalcogenide compound that is able to produce a reversible crystallization or amorphization phase change, but this is not used to limit the scope of the present disclosure. Any chalcogenide compound that is able to produce a reversible crystallization or amorphization phase change should fall within the protection scope of the materials for the phase-change function unit used in the present disclosure.

In a possible embodiment, the material of the Y-branch waveguide is $Si_3N_4$.

In a second aspect, the present disclosure provides an all-binary logic implementation method for the Y-branch phase-change all-optical Boolean logic device provided in the first aspect, which includes the following steps:

when the preset detection signal detects that both phase-change function units are in the amorphous state, the detection signal outputs a logic value of 1 after reading the two phase-change function units, in other cases, the output logic value is 0;

a three-step operation is preset to input corresponding logic values to the two phase-change function units respectively; 16 operating modes of binary Boolean logic operation are preset and combined with the three-step operation to input logic values to the two phase-change function units respectively, and then the detection light signal is input to the two Y branches respectively to read the state of the two phase-change function units by detecting the intensity of the output light signal and comparing the intensity of the output light signal with the intensity of the input detection signal, and the result of the Boolean logic operation is obtained, thus realizing a full-binary Boolean logic operation; wherein inputting a logic value to the phase-change function unit refers to inputting the corresponding optical pulse signal to the phase-change function unit using the above three-step operation.

Specifically, the three-step operation is preset by inputting corresponding logic values to the two phase-change function units respectively. When a logic value 0 is input to the first phase-change function unit, in the first step of operation, the first optical pulse signal is input to the waveguide branch side where the first phase-change function unit is located. In the second step of operation, the second optical pulse signal is input to the waveguide branch side where the first phase-change function unit is located. In the third step of operation, the first optical pulse signal is input to the waveguide branch side where the first phase-change function unit is located.

When a logic value 1 is input to the first phase-change function unit, in the first step of operation, the second optical pulse signal is input to the waveguide branch side where the first phase-change function unit is located. In the second and third steps of the operation, no optical pulse signal is input to the waveguide branch side where the first phase-change function unit is located. When a logic value 0 is input to the second phase-change function unit, in the first step of operation, the second optical pulse signal is input to the waveguide branch side where the second phase-change function unit is located. In the second and third steps of the operation, no optical pulse signal is input to the waveguide branch side where the second phase-change function unit is located. When a logic value 1 is input to the second phase-change function unit, in the first, second and third operations of the operation, the first optical pulse signal is input to the waveguide branch side where the second phase-change function unit is located.

In an optional example, if an optical pulse signal is employed for each step of the three-step operation, the optical pulse signal acts for a preset effective time; the preset effective time is sufficient to make the phase-change function unit to heat up according to the power of the light absorbed thereby, thus generating a possible crystallization or amorphization phase change.

In an optional example, the 16 preset operating modes of binary Boolean logic operation are combined with the three-step operation to respectively input logic values to the two phase-change function units, specifically including:

(1) TRUE operation: in the first step of the operation, logic value 0 and logic value 1 are input to the first phase-change function unit and the second phase-change function unit respectively; in the second and the third steps of the operation, no optical pulse signal is input to the waveguide branch side where the two phase-change function units are located;

(2) FALSE operation: in the first step of the operation, logic value 1 and logic value 0 are input to the first phase-change function unit and the second phase-change function unit respectively; in the second and the third steps of the operation, no optical pulse signal is input to the waveguide branch side where the two phase-change function units are located;

(3) P operation: in the first step of the operation, logic value 0 and logic value P are input to the first phase-change function unit and the second phase-change function unit respectively; in the second and the third steps of the operation, no optical pulse signal is input to the waveguide branch side where the two phase-change function units are located;

(4) Q operation: in the first step of the operation, logic value 0 and logic value Q are input to the first phase-change function unit and the second phase-change function unit respectively; in the second and the third steps of the operation, no optical pulse signal is input to the waveguide branch side where the two phase-change function units are located;

(5) NOT P operation: in the first step of the operation, logic value P and logic value 1 are input to the first phase-change function unit and the second phase-change function unit respectively; in the second and the third steps of the operation, no optical pulse signal is input to the waveguide branch side where the two phase-change function units are located;

(6) NOT Q operation: in the first step of the operation, logic value Q and logic value 1 are input to the first phase-change function unit and the second phase-change function unit respectively; in the second and the third steps of the operation, no optical pulse signal is input to the waveguide branch side where the two phase-change function units are located;

(7) P AND Q operation: in the first step of the operation, logic value 0 and logic value Q are input to the first phase-change function unit and the second phase-change function unit respectively; in the second step of the operation, the logic value P is input into the first phase-change function unit, and no optical pulse signal is input to the waveguide branch side where the second phase-change function unit is located; in the third step of the operation, no optical pulse signal is input to the waveguide branch side where the two phase-change function units are located;

(8) P NAND Q operation: in the first step of the operation, logic value 0 and logic value P are input to the first phase-change function unit and the second phase-change function unit respectively; in the second step of the operation, the logic value $\overline{Q}$ is input into the second phase-change function unit, and no optical pulse signal is input to the waveguide branch side where the first phase-change function unit is located; in the third step of the operation, no optical pulse signal is input to the waveguide branch side where the two phase-change function units are located;

(9) P OR Q operation: in the first step of the operation, logic value 0 and logic value P are input to the first phase-change function unit and the second phase-change function unit respectively; in the second step of the operation, the logic value Q is input into the second phase-change function unit, and no optical pulse signal is input to the waveguide branch side where the first phase-change function unit is located; in the third step of the operation, no optical pulse signal is input to the waveguide branch side where the two phase-change function units are located;

(10) P NOR Q operation: in the first step of the operation, logic value 0 and logic value $\overline{Q}$ are input to the first phase-change function unit and the second phase-change function unit respectively; in the second step of the operation, the logic value $\overline{P}$ is input into the first phase-change function unit, and no optical pulse signal is input to the waveguide branch side where the second phase-change function unit is located; in the third step of the operation, no optical pulse signal is input to the waveguide branch side where the two phase-change function units are located;

(11) P IMP Q operation: in the first step of the operation, logic value 0 and logic value $\overline{P}$ are input to the first phase-change function unit and the second phase-change function unit respectively; in the second step of the operation, the logic value Q is input into the second phase-change function unit, and no optical pulse signal is input to the waveguide branch side where the first phase-change function unit is located; in the third step of the operation, no optical pulse signal is input to the waveguide branch side where the two phase-change function units are located;

(12) P NIMP Q operation: in the first step of the operation, logic value 0 and logic value $\overline{Q}$ are input to the first phase-change function unit and the second phase-change function unit respectively; in the second step of the operation, the logic value P is input into the first phase-change function unit, and no optical pulse signal is input to the waveguide branch side where the second phase-change function unit is located; in the third step of the operation, no optical pulse signal is input to the waveguide branch side where the two phase-change function units are located;

(13) P RIMP Q operation: in the first step of the operation, logic value 0 and logic value P are input to the first phase-change function unit and the second phase-change function unit respectively; in the second step of the operation, the logic value $\overline{Q}$ is input into the second phase-change function unit, and no optical pulse signal is input to the waveguide branch side where the first phase-change function unit is located; in the third step of the operation, no optical pulse signal is input to the waveguide branch side where the two phase-change function units are located;

(14) P RNIMP Q operation: in the first step of the operation, logic value 0 and logic value Q are input to the first phase-change function unit and the second phase-change function unit respectively; in the second step of the operation, the logic value $\overline{P}$ is input into the first phase-change function unit, and no optical pulse signal is input to the waveguide branch side where the second phase-change function unit is located; in the third step of the operation, no optical pulse signal is input to the waveguide branch side where the two phase-change function units are located;

(15) P XOR Q operation: in the first step of the operation, logic value P and logic value P are input to the first phase-change function unit and the second phase-change function unit respectively; in the second step of the operation, the logic value Q is input into the second phase-change function unit, and no optical pulse signal is input to the waveguide branch side where the first phase-change function unit is located; in the third step of the operation, the logic value Q is input to the first phase-change function unit, and no optical pulse signal is input to the waveguide branch side where the second phase-change function unit is located;

(16) P XNOR Q operation: in the first step of the operation, logic value 0 and logic value $\overline{P}$ are input to the first phase-change function unit and the second phase-change function unit respectively; in the second step of the operation, the logic value P and the logic value Q are input into the first phase-change function unit and the second phase-change function unit respectively; in the third step of the operation, the logic value Q and the logic value $\overline{P}$ are input into the first phase-change function unit and the second phase-change function unit respectively.

In an optional example, before each binary Boolean logic operation is performed, a second optical pulse signal is input to the waveguide branch side where the first phase-change function unit and the second phase-change function unit are located, so that both phase-change function units reach the amorphous state to perform a reset operation on the two phase-change function units.

Generally speaking, compared with the related art, the above technical solution conceived by the present disclosure has the following advantageous effects:

the disclosure provides a Y-branch phase-change all-optical Boolean logic device and an all-binary logic implementation method therefor. Compared with electrical logic gates, optical device logic gates are characterized in fast speed, insensitivity to electromagnetic interference, and the ability to operate in parallel. In the meantime, the optical-electrical-optical conversion process may be avoided in current applications, thus further improving system bandwidth and reducing system power consumption. The present disclosure employs phase-change materials as storage media, which has good long-term non-volatility. The combination of the unique phase-change properties of phase-change materials and the concept of reconfigurable computing not only has the flexibility of reconfigurable computing, but also has the characteristics of fast transforming speed and good non-volatility of phase-change materials, which is of great significance to the research on integration of storage and computing. In addition, for some phase-change optical logic devices that have emerged so far, the present disclosure provides a simple Y-branch waveguide structure with a simple process and is able to realize 16 binary Boolean logic calculation functions through three operation steps, thus considerably improving the working efficiency of the device.

BRIEF DESCRIPTION OF THE DRAWINGS

FIG. 5A is the P1 pulse acting on the amorphous state, FIG. 5B is the P0 pulse acting on the amorphous state, FIG. 5C is the P1 pulse acting on the partially crystalline state, and FIG. 5D is the P0 pulse acting on the partially crystalline state.

DESCRIPTION OF THE EMBODIMENTS

Figure 1:
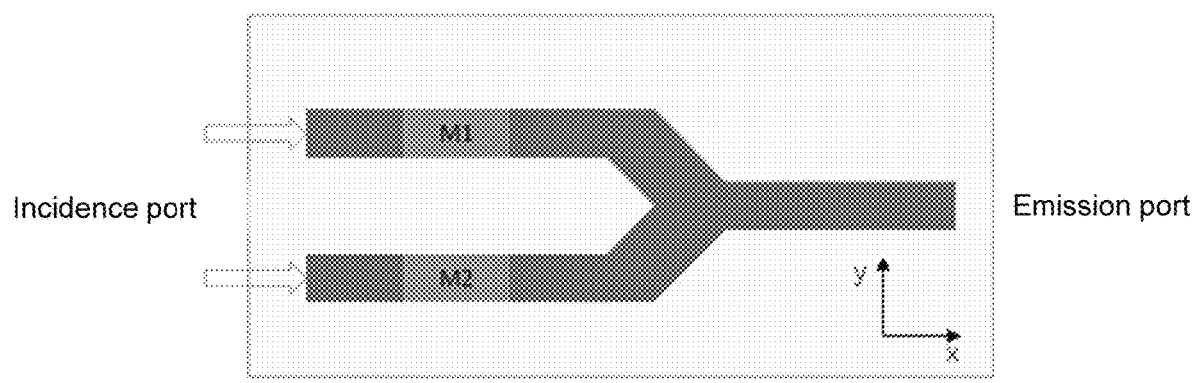
FIG. 1 is a schematic top view of a device structure provided by the present disclosure. A Y-branch waveguide and a phase-change function unit are prepared on a silicon dioxide substrate, where M1 and M2 respectively represent two phase-change function units covered with protective layers.

In order to make the purpose, technical solutions and advantages of the present disclosure more clear, the present disclosure will be further described in detail below with reference to the accompanying drawings and embodiments. It should be understood that the specific embodiments described here are only used to explain the present disclosure and are not intended to limit the present disclosure.

The disclosure discloses a Y-branch waveguide-type reconfigurable all-optical Boolean logic device based on phase-change materials and an all-binary logic implementation method therefor. The device includes a Y-branch structured waveguide and a phase-change function unit covering the top of the waveguide and a protective layer thereof. In the logic implementation method, a relatively high-power light pulse is employed to write to the phase-change function unit, causing the phase-change function unit to heat up and produce a crystallization or amorphization phase change, resulting in difference in optical properties in two states; a relatively low-power light pulse is adopted to read the state of the phase-change function unit without changing the state of the phase-change material. By defining the input logic signals respectively and defining three operation steps, the logic of reconfigurable operation mode may be realized. Through divided operation steps, all 16 binary Boolean logic calculations may be realized in this simple structure. Compared with electrical logic gates, the present disclosure has the advantages of being resistant to electromagnetic interference and the ability to be operated in parallel. The phase-change material has good long-term non-volatility as a storage medium. The combination of storage and calculation has great significance for the research on integration of storage and calculation. Through the reconfigurable operation method, 16 binary Boolean logic calculation functions are realized, which considerably improves the efficiency of logic calculation.

In view of the above defects or needs of improvement the existing technology, the present disclosure provides a Y-branch waveguide-type reconfigurable all-optical Boolean logic device based on phase-change materials and an all-binary logic implementation method therefor. The present disclosure employs an optical method that is more competitive to solve the technical bottleneck currently encountered in the integration of all-optical storage and computing, and improves the reconfigurability and logic integration of phase-change optical logic devices. The disclosure includes but is not limited to an optical waveguide structure that realizes optical logic calculation based on phase-change materials, and a logic implementation operation method thereof. The device structure consists of a substrate, a Y-branch waveguide and a phase-change function unit.

Since light tends to enter materials with a complex refractive index having a large real part when being transmitted in different materials, when a waveguide material with a lower refractive index is covered with a phase-change material with a higher refractive index on the top, a part of light will enter the phase-change material and propagates, that is, evanescent wave coupling. Phase-change materials are able to be transformed between crystalline state and amorphous state under the effect of appropriate light pulses, and both states can remain stable and have non-volatility. In view of the above, the state of the phase-change function unit may be transformed through light pulses representing different logic signals. In the crystalline state and amorphous state respectively, the refractive indices of phase-change materials are considerably different, wherein some of the imaginary parts differ by more than ten times, which means that there is a great difference in the light transmittance of phase-change materials in different states. Accordingly, it is possible to read the state of the phase-change material by emitting the light pulse or continuous light with low power that is not sufficient to change the state of the phase-change material to detect the transmittance of the light pulse or continuous light.

Reconfigurable computing refers to a form of computing organization that is able to realize spatial mapping from algorithms to computing engines. The operation mode of the present disclosure includes controlling the width of the written light pulse of a certain power to obtain pulses of different pulse widths to simulate light pulse signals with signal values of "0" and "1". Preferably, pulses with two different power are employed to control the write and read operations of the phase-change unit respectively. Writing pulses requires high power, the phase-change function unit may be crystallized or amorphized through evanescent wave coupling; reading pulses (or continuous light) requires lower power, and the power is not sufficient to make the phase-change function unit to be crystallized or amorphized through evanescent wave coupling, and is only for reading the state of the phase-change function unit.

The technical features involved in the various embodiments of the present disclosure described below may be combined with each other as long as they do not conflict with each other. The types of materials and process dimensions used in preparation of device in the embodiments are all preferred types and do not limit the present disclosure in any ways.

It should be noted that the real part of the complex refractive index of the phase-change function unit selected in the present disclosure is greater than the real part of the complex refractive index of the Y-branch waveguide, and the imaginary part of the complex refractive index of the phase-change function unit is not 0, wherein the complex refractive index mentioned in the present disclosure refers to the complex refractive index of the phase-change function unit and the Y-branch waveguide under the signal wavelengths of the optical pulse signal and the detection signal. More specifically, the wavelength parameters of the optical pulse signal and detection signal, as well as the material parameters of the phase-change function unit, protective layer or Y-branch waveguide selected in the present disclosure all serve as examples and do not limit the protection scope of the present disclosure in any ways. As long as wavelengths of light and corresponding materials satisfy the relationship between the complex refractive index of the phase-change function unit and the Y-branch waveguide under the signal wavelengths of the optical pulse signal and the detection signal as follows: the real part of the complex refractive index of the phase-change function unit is greater than the real part of the complex refractive index of the Y-branch waveguide, and the imaginary part of the complex refractive index of the phase-change function unit is not 0, they should all fall within the protection scope of the present disclosure.

Example 1

Figure 2:
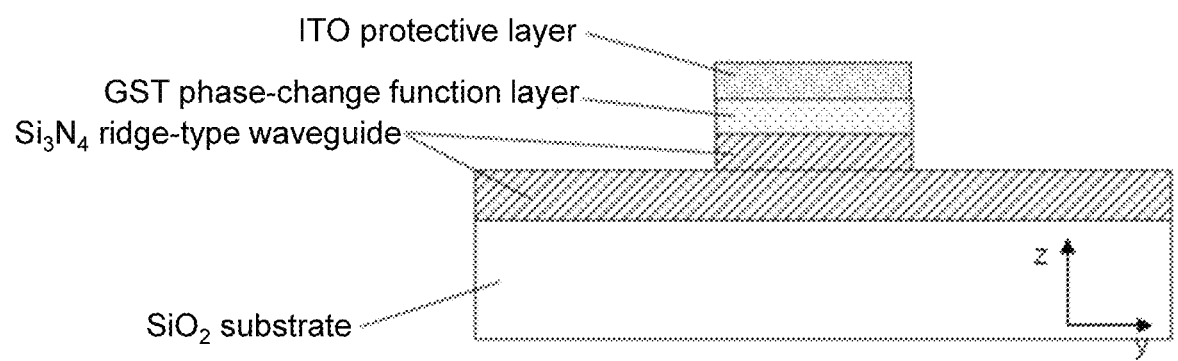
FIG. 2 is a cross-sectional view showing a position of the phase-change function unit provided by the present disclosure perpendicular to a light propagation direction. The materials adopted from the bottom to the top are: silicon dioxide ($SiO_2$), silicon nitride ($Si_3N_4$), phase-change material, and indium tin oxide (ITO).

This embodiment is shown in FIG. 1 and FIG. 2. FIG. 1 is a schematic top view of a device. FIG. 2 is a cross-sectional view showing a position of the phase-change function unit perpendicular to a light propagation direction.

The phase-change optical logic device includes a silicon dioxide ($SiO_2$) substrate, a Y-branched silicon nitride ridge waveguide ($Si_3N_4$), a GST phase-change function unit layer ($Ge_2Sb_2Te_5$), and an indium tin oxide (ITO) protective layer. In this embodiment, a common phase-change material $Ge_2Sb_2Te_5$ was selected, but the disclosure is not limited to the phase-change material. The preparation process thereof may be as follows.

In the first step, a layer of silicon nitride with a thickness of 150 nm was sputtered on a silicon dioxide substrate which was 0.5 mm thick using magnetron sputtering.

In the second step, photoresist was spin-coated on the surface of the prepared film, and the required Y-branch waveguide pattern was obtained through photolithography, development, magnetron sputtering, and stripping by using the designed mask.

In the third step, a secondary photolithography was performed to prepare the required $Ge_2Sb_2Te_5$ function unit region pattern and indium tin oxide (ITO) protective layer.

In the fourth step, the $Ge_2Sb_2Te_5$ phase-change optical logic device was employed to construct a logic operator, and the logic function of the device was tested and inspected in the pump-probe light test system. The test temperature was room temperature. According to the designed input operation mode, the device is crystallized and amorphous with the input of pump light, and the state of the device was read through detection light.

It should be noted that the above preparation method is not the one and only, and any method that is able to prepare the structures shown in FIG. 1 and FIG. 2 should fall within the protection scope of the present disclosure.

Example 2

Figure 3:
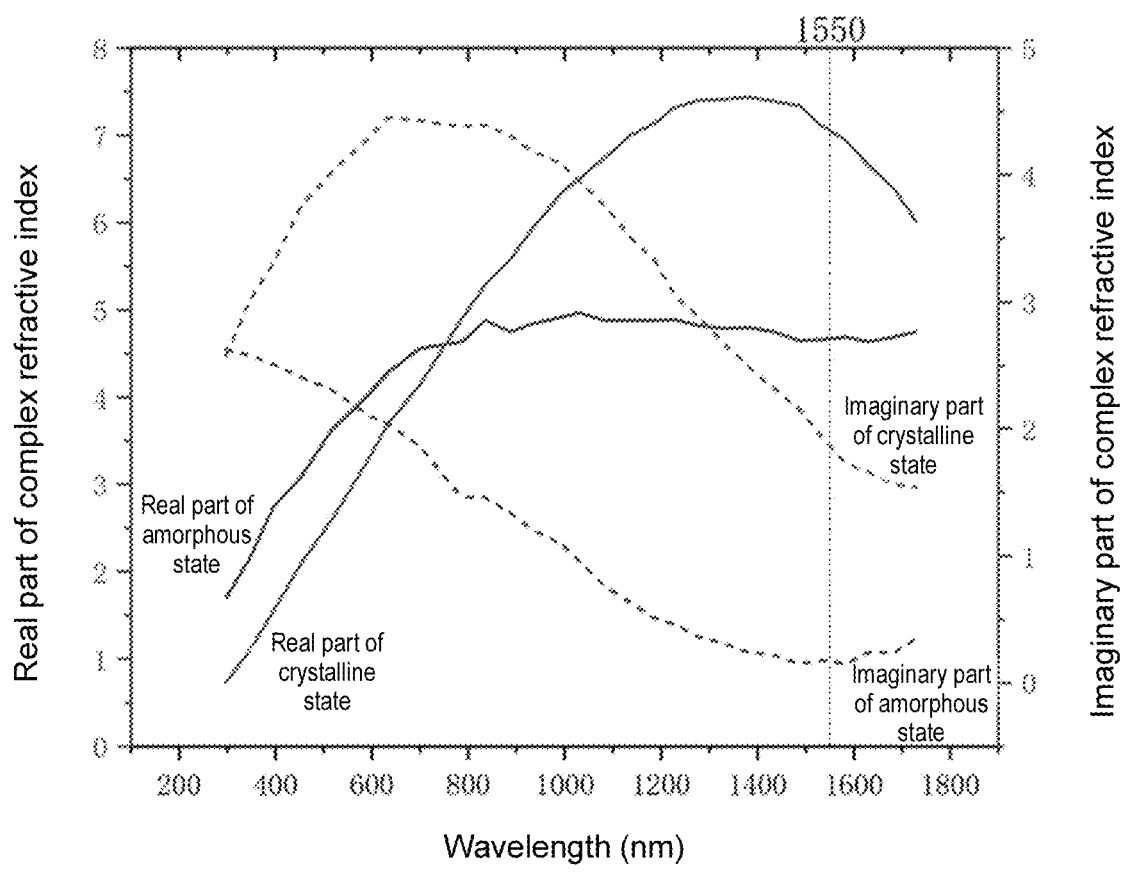
FIG. 3 is a complex refractive index spectrum of the phase-change material $Ge_2Sb_2Te_5$ in a crystalline state and an amorphous state at room temperature provided by the present disclosure.
Figure 4:
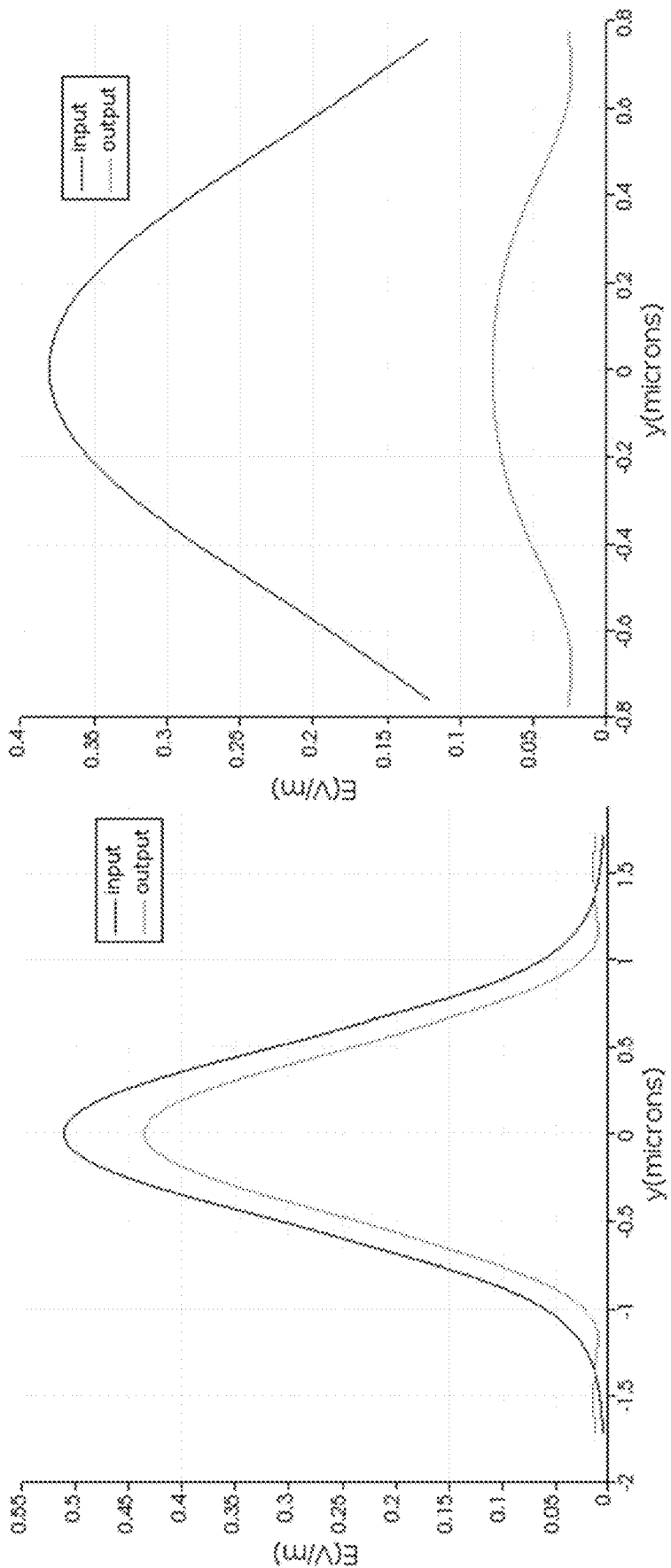
FIG. 4 is a schematic view illustrating the comparison of electric field intensity before and after inputting light pulses to the phase-change function unit in the amorphous state and the crystalline state provided by the present disclosure.
Figure 5A:
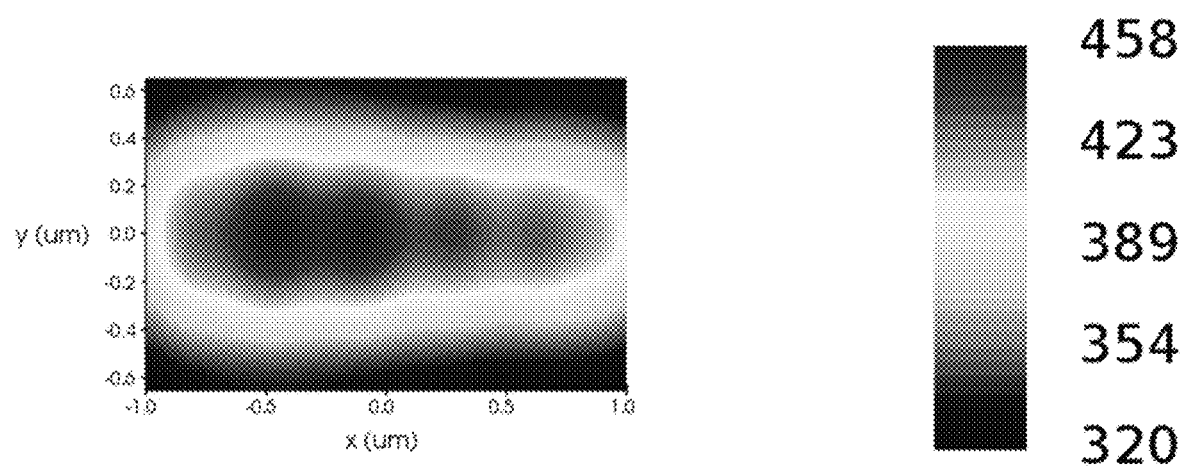
FIG. 5A-FIG. 5D are temperature distribution diagrams of the phase-change function unit provided by the present disclosure in the amorphous state and the crystalline state respectively after being acted upon by P1 and P0 (the unit of temperature in the figure is K), where
Figure 5B:
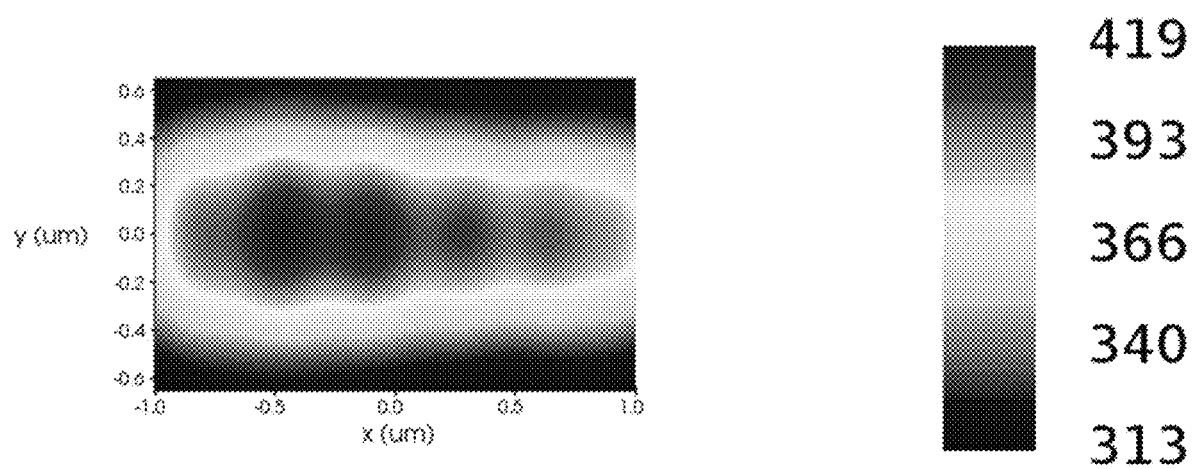
Figure 5C:
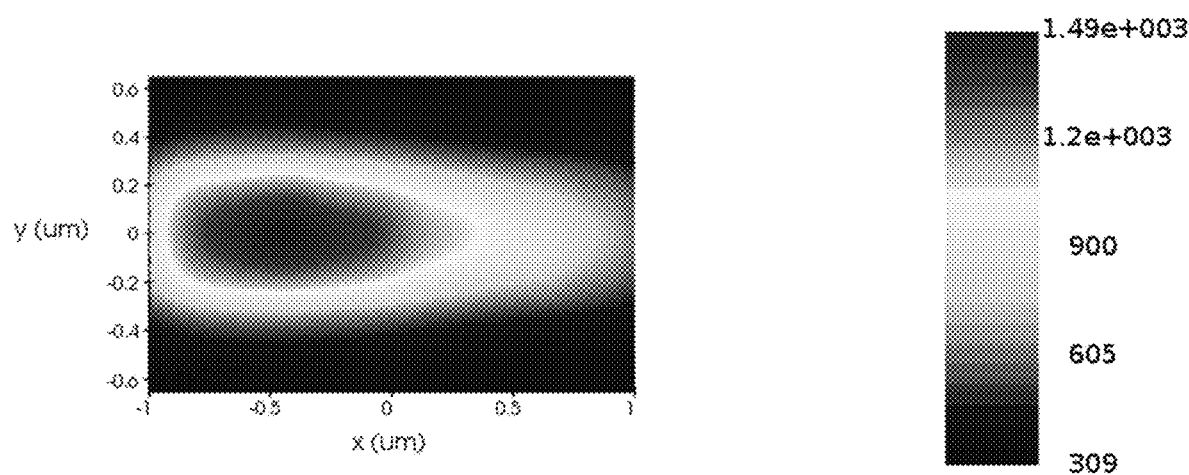
Figure 5D:
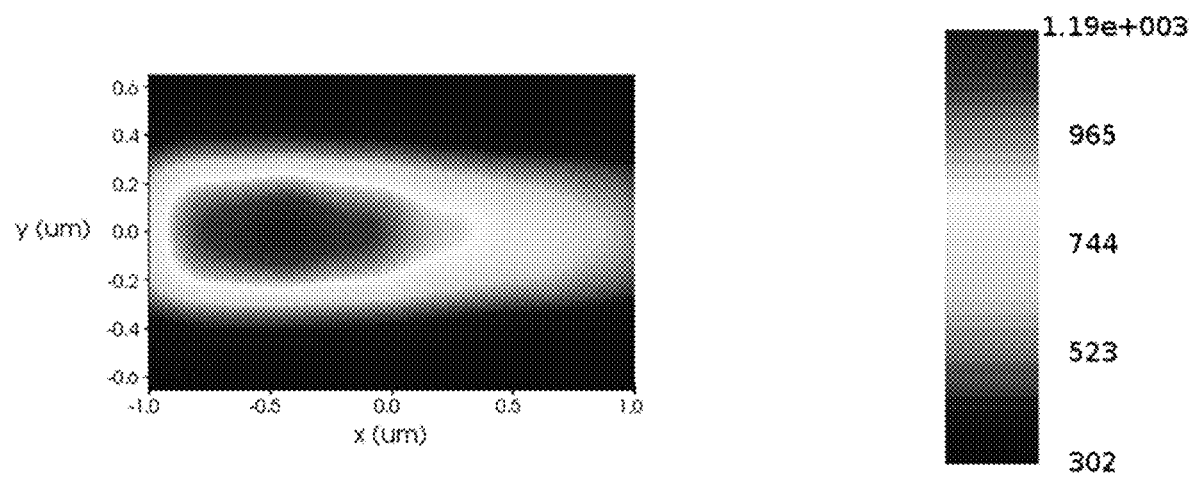

Since light tends to enter materials with a complex refractive index having a large real part when being transmitted in different materials, when a waveguide material with a lower refractive index is covered with a phase-change material with a higher refractive index on the top, a part of light will enter the phase-change material and propagates, that is, evanescent wave coupling. In this way, on the one hand, because the imaginary part of the complex refractive index of the phase-change material is not 0, light will be absorbed and therefore will be influenced by the pulse light of a certain power, the temperature rises and phase change (crystallization or amorphization) will be generated. In view of the foregoing, light pulses with higher power may be input to realize the write operation to the phase-change function unit. On the other hand, when the phase-change material is in the crystalline state or amorphous state, the transmittance is T=1−R−A under normal incidence, wherein R represents the refractive index of the phase-change material, and A represents the absorption rate of the phase-change material. FIG. 3 is a complex refractive index spectrum of the phase-change material $Ge_2Sb_2Te_5$ in a crystalline state and an amorphous state. It can be seen that in the band near 1550 nm, the refractive index R and absorptivity A (positively related to the imaginary part) of the phase-change material in the crystalline state were both greater than the phase-change material in the amorphous state, so the transmittance under the crystalline state was lower than that the transmittance under the amorphous state, and therefore a part of the light transmitted in a phase-change unit was affected by changes in the transmittance of the light. When light of the same power was incident, the output optical power coupled with the phase-change material in the crystalline state would be low, and the output optical power coupled with the phase-change material in the amorphous state would be high. In view of the foregoing, light pulses with lower power may be input and the emitted light after evanescent wave coupling was collected to analyze the state of the phase-change material, thereby realizing the read operation of the state of the phase-change function unit. FIG. 4 shows comparative simulation of normalized electric field strength at the phase-change layer in the phase-change function unit (taking $Ge_2Sb_2Te_5$ as an example) before and after the 1550 nm optical pulse in the waveguide passes through the phase-change unit when the phase-change material was in the crystalline state and the amorphous state respectively. It could be clearly seen that the transmittance of the phase-change material in the amorphous state was high, and the electric field strength had no substantially obvious attenuation. The transmittance of the phase-change material in the crystalline state was low, and the amplitude of the light pulse was significantly attenuated after the light pulse was emitted.

FIG. 5A-FIG. 5D (taking Ge2Sb2Te5 as an example) show the temperature change simulation results obtained by applying different pulses to the phase-change function unit in the initial amorphous and crystalline states, wherein the melting temperature of Ge2Sb2Te5 was about 900K and the crystallization temperature was 430K. Assume that the pulse width was 26 ns, the pulse with an amplitude of 10 mW was P1, the pulse was 13 ns, and the pulse with an amplitude of 10 mW was P0. The initial states of the phase-change function unit in FIG. 5A and FIG. 5B were amorphous state, and were affected by pulses P1 and P0 respectively. The initial states of the phase-change function unit in FIG. 5C and FIG. 5D were partially crystalline state, and were affected by pulses P1 and P0 respectively. The statistics pertaining to the highest temperature and phase changes of the phase-change function unit are shown in Table 1 below.

TABLE 1

Statistics pertaining to phase changes in amorphous and partially crystalline states under the effect of pulses P1 and P0

| | Initial state | | | |
|---|---|---|---|---|
| | Amorphous state | Amorphous state | Partially crystalline state | Partially crystalline state |
| Excitation pulse | P1 | P0 | P1 | P0 |
| Highest temperature | 458K | 419K | 1490K | 1190K |
| Phase change | Partially crystallized | Maintain amorphous state | Amorphization | Amorphization |

When the initial state of the phase-change function unit was amorphous state, the temperature in some region exceeded the crystallization temperature under the effect of pulse P1, resulting in partial crystallization. Under the effect of pulse P0, the temperature was not high enough to reach the crystallization temperature, so the amorphous state was maintained; when the initial state was partially crystalline state, amorphization could be achieved under the effect of pulses P1 and P0. It can be seen that in the two initial states, amorphization could be achieved under the effect of pulse P0. Therefore, P0 was chosen as the reset pulse of the phase-change function unit, and the phase-change function unit was reset before each logic calculation started.

The reset pulse was input from the M1 input terminal and M2 input terminal of the straight waveguide in FIG. 1. It was set that when M1 and M2 are both in the amorphous state, the output logic value after reading by the detection light was 1. In other cases, the output logic value was 0. The corresponding relationship may be found in Table 2 below.

TABLE 2

Correspondence between states of phase-change unit and logic output

| M1 | M2 | Output logic value |
|---|---|---|
| Crystalline (low transmittance) | Crystalline (low transmittance) | 0 |
| Crystalline (low transmittance) | Amorphous (high transmittance) | 0 |
| Amorphous (high transmittance) | Crystalline (low transmittance) | 0 |
| Amorphous (high transmittance) | Amorphous (high transmittance) | 1 |

The logic calculation process is implemented through three operation steps S1, S2, and S3. The phase-change states of M1 and M2 were modulated according to the logic values that need to be substituted into the calculation. Table 3 shows the input pulses corresponding to the logic signal values in each operation step, wherein x means that the input is empty, that is, there is no input. Table 4 shows the specific operation methods when different logic calculations are performed. When performing a logic operation, it was first determined what kind of logic calculation is to be performed, the corresponding input logic value for M1 and M2 is found in each step in Table 4, and the pulse (P1, P0 or x) corresponding to the logic value in each step of Table 3 was input into M1 and M2 respectively.

TABLE 3

Rules of corresponding physical input for logic signals

|  | S1 | | S2 | | S3 | |
| --- | --- | --- | --- | --- | --- | --- |
|  | M1 | M2 | M1 | M2 | M1 | M2 |
| 0 | P1 | P0 | P0 | X | P1 | X |
| 1 | P0 | P1 | x | P1 | x | P1 |

TABLE 4

Correspondence between logic functions and logic operation modes

| Boolean logic | Input P | Input Q | Output | S1 M1 | S1 M2 | S2 M1 | S2 M2 | S3 M1 | S3 M2 |
| --- | --- | --- | --- | --- | --- | --- | --- | --- | --- |
| TRUE |  |  | 1 | 0 | 1 | x | x | x | x |
|  | 0 | 0 | 1 | 0 | 1 | x | x | x | x |
|  | 0 | 1 | 1 | 0 | 1 | x | x | x | x |
|  | 1 | 0 | 1 | 0 | 1 | x | x | x | x |
|  | 1 | 1 | 1 | 0 | 1 | x | x | x | x |
| FALSE |  |  | 0 | 1 | 0 | x | x | x | x |
|  | 0 | 0 | 0 | 1 | 0 | x | x | x | x |
|  | 0 | 1 | 0 | 1 | 0 | x | x | x | x |
|  | 1 | 0 | 0 | 1 | 0 | x | x | x | x |
|  | 1 | 1 | 0 | 1 | 0 | x | x | x | x |
| P |  |  | P | 0 | P | x | x | x | x |
|  | 0 | 0 | 0 | 0 | 0 | x | x | x | x |
|  | 0 | 1 | 0 | 0 | 0 | x | x | x | x |
|  | 1 | 0 | 1 | 0 | 1 | x | x | x | x |
|  | 1 | 1 | 1 | 0 | 1 | x | x | x | x |
| Q |  |  | Q | 0 | Q | x | x | x | x |
|  | 0 | 0 | 0 | 0 | 0 | x | x | x | x |
|  | 0 | 1 | 1 | 0 | 1 | x | x | x | x |
|  | 1 | 0 | 0 | 0 | 0 | x | x | x | x |
|  | 1 | 1 | 1 | 0 | 1 | x | x | x | x |
| NOT P |  |  | $\overline{P}$ | P | 1 | x | x | x | x |
|  | 0 | 0 | 1 | 1 | 1 | x | x | x | x |
|  | 0 | 1 | 1 | 1 | 1 | x | x | x | x |
|  | 1 | 0 | 0 | 0 | 1 | x | x | x | x |
|  | 1 | 1 | 0 | 0 | 1 | x | x | x | x |
| NOT Q |  |  | $\overline{Q}$ | Q | 1 | x | x | x | x |
|  | 0 | 0 | 1 | 1 | 1 | x | x | x | x |
|  | 0 | 1 | 0 | 0 | 1 | x | x | x | x |
|  | 1 | 0 | 1 | 1 | 1 | x | x | x | x |
|  | 1 | 1 | 0 | 0 | 1 | x | x | x | x |
| P AND Q |  |  | PQ | 0 | Q | P | x | x | x |
|  | 0 | 0 | 0 | 0 | 0 | 0 | x | x | x |
|  | 0 | 1 | 0 | 0 | 1 | 0 | x | x | x |
|  | 1 | 0 | 0 | 0 | 0 | 1 | x | x | x |
|  | 1 | 1 | 1 | 0 | 1 | 1 | x | x | x |
| P NAND Q |  |  | $\overline{P} + \overline{Q}$ | 0 | $\overline{P}$ | x | $\overline{Q}$ | x | x |
|  | 0 | 0 | 1 | 0 | 1 | x | 1 | x | x |
|  | 0 | 1 | 1 | 0 | 1 | x | 0 | x | x |
|  | 1 | 0 | 1 | 0 | 0 | x | 1 | x | x |
|  | 1 | 1 | 0 | 0 | 0 | x | 0 | x | x |
| P OR Q |  |  | P + Q | 0 | P | x | Q | x | x |
|  | 0 | 0 | 0 | 0 | 0 | x | 0 | x | x |
|  | 0 | 1 | 1 | 0 | 0 | x | 1 | x | x |
|  | 1 | 0 | 1 | 0 | 1 | x | 0 | x | x |
|  | 1 | 1 | 1 | 0 | 1 | x | 1 | x | x |
| P NOR Q |  |  | $\overline{PQ}$ | 0 | $\overline{Q}$ | $\overline{P}$ | x | x | x |
|  | 0 | 0 | 1 | 0 | 1 | 1 | x | x | x |
|  | 0 | 1 | 0 | 0 | 0 | 1 | x | x | x |
|  | 1 | 0 | 0 | 0 | 1 | 0 | x | x | x |
|  | 1 | 1 | 0 | 0 | 0 | 0 | x | x | x |
| P IMP Q |  |  | $\overline{P} + Q$ | 0 | $\overline{P}$ | x | Q | x | x |
|  | 0 | 0 | 1 | 0 | 1 | x | 0 | x | x |
|  | 0 | 1 | 1 | 0 | 1 | x | 1 | x | x |
|  | 1 | 0 | 0 | 0 | 0 | x | 0 | x | x |
|  | 1 | 1 | 1 | 0 | 0 | x | 1 | x | x |
| P NIMP Q |  |  | $P\overline{Q}$ | 0 | $\overline{Q}$ | P | x | x | x |
|  | 0 | 0 | 0 | 0 | 1 | 0 | x | x | x |
|  | 0 | 1 | 0 | 0 | 0 | 0 | x | x | x |
|  | 1 | 0 | 1 | 0 | 1 | 1 | x | x | x |
|  | 1 | 1 | 0 | 0 | 0 | 1 | x | x | x |
| P RIMP Q |  |  | $P + \overline{Q}$ | 0 | P | x | $\overline{Q}$ | x | x |
|  | 0 | 0 | 1 | 0 | 0 | x | 1 | x | x |
|  | 0 | 1 | 0 | 0 | 0 | x | 0 | x | x |
|  | 1 | 0 | 1 | 0 | 1 | x | 1 | x | x |
|  | 1 | 1 | 1 | 0 | 1 | x | 0 | x | x |
| P RNIMP Q |  |  | $\overline{P}Q$ | 0 | Q | $\overline{P}$ | x | x | x |
|  | 0 | 0 | 0 | 0 | 0 | 1 | x | x | x |
|  | 0 | 1 | 1 | 0 | 1 | 1 | x | x | x |
|  | 1 | 0 | 0 | 0 | 0 | 0 | x | x | x |
|  | 1 | 1 | 0 | 0 | 1 | 0 | x | x | x |
| P XOR Q |  |  | $P\overline{Q} + \overline{P}Q$ | P | P | x | Q | Q | x |
|  | 0 | 0 | 0 | 0 | 0 | x | 0 | 0 | x |
|  | 0 | 1 | 1 | 0 | 0 | x | 1 | 1 | x |
|  | 1 | 0 | 1 | 1 | 1 | x | 0 | 0 | x |
|  | 1 | 1 | 0 | 1 | 1 | x | 1 | 1 | x |
| P XNOR Q |  |  | $(\overline{P} + Q) \cdot (P + \overline{Q})$ | 0 | $\overline{P}$ | P | Q | Q | $\overline{P}$ |
|  | 0 | 0 | 1 | 0 | 1 | 0 | 0 | 0 | 1 |
|  | 0 | 1 | 0 | 0 | 1 | 0 | 1 | 1 | 1 |
|  | 1 | 0 | 0 | 0 | 0 | 1 | 0 | 0 | 0 |
|  | 1 | 1 | 1 | 0 | 0 | 1 | 1 | 1 | 0 |

Preferably, the 16 binary logic operation modes are:

(1) True: in the operation step S1, 0 and 1 were input to the input terminals of M1 and M2 respectively; in the operation step S2, x and x were input to the input terminals of M1 and M2 respectively; in the operation step S3, x and x were respectively input to the input terminals of M1 and M2.

When P=0 and Q=0, it could be obtained that after the operation step S1 was performed. M1 was in the amorphous state and M2 was in the amorphous state; after the operation step S2 was performed, M1 was in the amorphous state and M2 was in the amorphous state; after the operation step S3 was performed, M1 was in the amorphous state and M2 was in the amorphous state, and therefore the output signal value was 1, which realizes that logic operation True=1.

When P=0 and Q=1, it could be obtained that after the operation step S1 was performed. M1 was in the amorphous state and M2 was in the amorphous state; after the operation step S2 was performed, M1 was in the amorphous state and M2 was in the amorphous state; after the operation step S3 was performed, M1 was in the amorphous state and M2 was in the amorphous state, and therefore the output signal value was 1, which realizes that the logic operation True=1.

When P=1 and Q=0, it could be obtained that after the operation step S1 was performed, M1 was in the amorphous state and M2 was in the amorphous state; after the operation step S2 was performed, M1 was in the amorphous state and M2 was in the amorphous state; after the operation step S3 was performed, M1 was in the amorphous state and M2 was in the amorphous state, and therefore the output signal value was 1, which realizes that the logic operation True=1.

When P=1 and Q=1, it could be obtained that after the operation step S1 was performed, M1 was in the amorphous state and M2 was in the amorphous state; after the operation step S2 was performed, M1 was in the amorphous state and M2 was in the amorphous state; after the operation step S3 was performed, M1 was in the amorphous state and M2 was in the amorphous state, and therefore the output signal value was 1, which realizes that the logic operation True=1.

(2) False: in the operation step S1, 1 and 0 were input to the input terminals of M1 and M2 respectively; in the operation step S2, x and x were input to the input terminals of M1 and M2 respectively: in the operation step S3, x and x were respectively input to the input terminals of M1 and M2.

When P=0 and Q=0, it could be obtained that after the operation step S1 was performed, M1 was in the crystalline state and M2 was in the crystalline state; after the operation step S2 was performed, M1 was in the crystalline state and M2 was in the crystalline state; after the operation step S3 was performed, M1 was in the crystalline state and M2 was in the crystalline state, and therefore the output signal value was 0, which realizes that logic operation False=0.

When P=0 and Q=1, it could be obtained that after the operation step S1 was performed, M1 was in the crystalline state and M2 was in the crystalline state; after the operation step S2 was performed, M1 was in the crystalline state and M2 was in the crystalline state; after the operation step S3 was performed, M1 was in the crystalline state and M2 was in the crystalline state, and therefore the output signal value was 0, which realizes that logic operation False=0.

When P=1 and Q=0, it could be obtained that after the operation step S1 was performed, M1 was in the crystalline state and M2 was in the crystalline state; after the operation step S2 was performed, M1 was in the crystalline state and M2 was in the crystalline state; after the operation step S3 was performed, M1 was in the crystalline state and M2 was in the crystalline state, and therefore the output signal value was 0, which realizes that logic operation False=0.

When P=1 and Q=1, it could be obtained that after the operation step S1 was performed, M1 was in the crystalline state and M2 was in the crystalline state; after the operation step S2 was performed, M1 was in the crystalline state and M2 was in the crystalline state; after the operation step S3 was performed, M1 was in the crystalline state and M2 was in the crystalline state, and therefore the output signal value was 0, which realizes that logic operation False=0.

(3) P: in the operation step S1, 0 and P were input to the input terminals of M1 and M2 respectively; in the operation step S2, x and x were input to the input terminals of M1 and M2 respectively; in the operation step S3, x and x were respectively input to the input terminals of M1 and M2.

When P=0 and Q=0, it could be obtained that after the operation step S1 was performed, M1 was in the amorphous state and M2 was in the crystalline state; after the operation step S2 was performed, M1 was in the amorphous state and M2 was in the crystalline state; after the operation step S3 was performed, M1 was in the amorphous state and M2 was in the crystalline state, and therefore the output signal value was 0, which realizes that logic operation P=0.

When P=0 and Q=1, it could be obtained that after the operation step S1 was performed, M1 was in the amorphous state and M2 was in the crystalline state; after the operation step S2 was performed, M1 was in the amorphous state and M2 was in the crystalline state; after the operation step S3 was performed, M1 was in the amorphous state and M2 was in the crystalline state, and therefore the output signal value was 0, which realizes that logic operation P=0.

When P=1 and Q=0, it could be obtained that after the operation step S1 was performed, M1 was in the amorphous state and M2 was in the amorphous state; after the operation step S2 was performed, M1 was in the amorphous state and M2 was in the amorphous state; after the operation step S3 was performed, M1 was in the amorphous state and M2 was in the amorphous state, and therefore the output signal value was 0, which realizes that logic operation P=1.

When P=1 and Q=1, it could be obtained that after the operation step S1 was performed, M1 was in the amorphous state and M2 was in the amorphous state; after the operation step S2 was performed, M1 was in the amorphous state and M2 was in the amorphous state; after the operation step S3 was performed, M1 was in the amorphous state and M2 was in the amorphous state, and therefore the output signal value was 1, which realizes that logic operation P=1.

(4) Q: in the operation step S1, 0 and Q were input to the input terminals of M1 and M2 respectively; in the operation step S2, x and x were input to the input terminals of M1 and M2 respectively; in the operation step S3, x and x were respectively input to the input terminals of M1 and M2.

When P=0 and Q=0, it could be obtained that after the operation step S1 was performed, M1 was in the amorphous state and M2 was in the crystalline state; after the operation step S2 was performed, M1 was in the amorphous state and M2 was in the crystalline state; after the operation step S3 was performed, M1 was in the amorphous state and M2 was in the crystalline state, and therefore the output signal value was 0, which realizes that logic operation Q=0.

When P=0 and Q=1, it could be obtained that after the operation step S1 was performed, M1 was in the amorphous state and M2 was in the amorphous state; after the operation step S2 was performed, M1 was in the amorphous state and M2 was in the amorphous state; after the operation step S3 was performed, M1 was in the amorphous state and M2 was in the amorphous state, and therefore the output signal value was 1, which realizes that logic operation Q=1.

When P=1 and Q=0, it could be obtained that after the operation step S1 was performed, M1 was in the amorphous state and M2 was in the crystalline state; after the operation step S2 was performed, M1 was in the amorphous state and M2 was in the crystalline state; after the operation step S3 was performed, M1 was in the amorphous state and M2 was in the crystalline state, and therefore the output signal value was 1, which realizes that logic operation Q=0.

When P=1 and Q=1, it could be obtained that after the operation step S1 was performed, M1 was in the amorphous state and M2 was in the amorphous state; after the operation step S2 was performed, M1 was in the amorphous state and M2 was in the amorphous state; after the operation step S3 was performed, M1 was in the amorphous state and M2 was in the amorphous state, and therefore the output signal value was 1, which realizes that logic operation Q=1.

(5) NOT P: in the operation step S1, P and 1 were input to the input terminals of M1 and M2 respectively; in the operation step S2, x and x were input to the input terminals of M1 and M2 respectively; in the operation step S3, x and x were respectively input to the input terminals of M1 and M2.

When P=0 and Q=0, it could be obtained that after the operation step S1 was performed, M1 was in the amorphous state and M2 was in the amorphous state; after the operation step S2 was performed, M1 was in the amorphous state and M2 was in the amorphous state; after the operation step S3 was performed, M1 was in the amorphous state and M2 was in the amorphous state, and therefore the output signal value was 1, which realizes that logic operation NOT P=1.

When P=0 and Q=1, it could be obtained that after the operation step S1 was performed, M1 was in the amorphous state and M2 was in the amorphous state; after the operation step S2 was performed, M1 was in the amorphous state and M2 was in the amorphous state; after the operation step S3 was performed, M1 was in the amorphous state and M2 was in the amorphous state, and therefore the output signal value was 1, which realizes that logic operation NOT P=1.

When P=1 and Q=0, it could be obtained that after the operation step S1 was performed. M1 was in the crystalline state and M2 was in the amorphous state; after the operation step S2 was performed, M1 was in the crystalline state and M2 was in the amorphous state; after the operation step S3 was performed, M1 was in the crystalline state and M2 was in the amorphous state, and therefore the output signal value was 0, which realizes that logic operation NOT P=0.

When P=1 and Q=1, it could be obtained that after the operation step S1 was performed, M1 was in the crystalline state and M2 was in the amorphous state; after the operation step S2 was performed, M1 was in the crystalline state and M2 was in the amorphous state; after the operation step S3 was performed, M1 was in the crystalline state and M2 was in the amorphous state, and therefore the output signal value was 0, which realizes that logic operation NOT P=0.

(6) NOT Q: in the operation step S1, Q and 1 were input to the input terminals of M1 and M2 respectively; in the operation step S2, x and x were input to the input terminals of M1 and M2 respectively; in the operation step S3, x and x were respectively input to the input terminals of M1 and M2.

When P=0 and Q=0, it could be obtained that after the operation step S1 was performed, M1 was in the amorphous state and M2 was in the amorphous state; after the operation step S2 was performed, M1 was in the amorphous state and M2 was in the amorphous state; after the operation step S3 was performed, M1 was in the amorphous state and M2 was in the amorphous state, and therefore the output signal value was 1, which realizes that logic operation NOT Q=1.

When P=0 and Q=1, it could be obtained that after the operation step S1 was performed, M1 was in the crystalline state and M2 was in the amorphous state; after the operation step S2 was performed, M1 was in the crystalline state and M2 was in the amorphous state; after the operation step S3 was performed, M1 was in the crystalline state and M2 was in the amorphous state, and therefore the output signal value was 1, which realizes that logic operation NOT Q=0.

When P=1 and Q=0, it could be obtained that after the operation step S1 was performed, M1 was in the amorphous state and M2 was in the amorphous state; after the operation step S2 was performed, M1 was in the amorphous state and M2 was in the amorphous state; after the operation step S3 was performed, M1 was in the amorphous state and M2 was in the amorphous state, and therefore the output signal value was 1, which realizes that logic operation NOT Q=1.

When P=1 and Q=1, it could be obtained that after the operation step S1 was performed, M1 was in the crystalline state and M2 was in the amorphous state; after the operation step S2 was performed, M1 was in the crystalline state and M2 was in the amorphous state; after the operation step S3 was performed, M1 was in the crystalline state and M2 was in the amorphous state, and therefore the output signal value was 1, which realizes that logic operation NOT Q=0.

(7) P AND Q: in the operation step S1, 0 and Q were input to the input terminals of M1 and M2 respectively: in the operation step S2, P and x were input to the input terminals of M1 and M2 respectively: in the operation step S3, x and x were respectively input to the input terminals of M1 and M2.

When P=0 and Q=0, it could be obtained that after the operation step S1 was performed, M1 was in the amorphous state and M2 was in the crystalline state; after the operation step S2 was performed, M1 was in the crystalline state and M2 was in the crystalline state; after the operation step S3 was performed, M1 was in the crystalline state and M2 was in the crystalline state, and therefore the output signal value was 0, which realizes that logic operation P AND Q=0 AND 0=0.

When P=0 and Q=1, it could be obtained that after the operation step S1 was performed, M1 was in the amorphous state and M2 was in the amorphous state; after the operation step S2 was performed, M1 was in the crystalline state and M2 was in the amorphous state; after the operation step S3 was performed, M1 was in the crystalline state and M2 was in the amorphous state, and therefore the output signal value was 0, which realizes that logic operation P AND Q=0 AND 1=0.

When P=1 and Q=0, it could be obtained that after the operation step S1 was performed, M1 was in the amorphous state and M2 was in the amorphous state; after the operation step S2 was performed, M1 was in the crystalline state and M2 was in the crystalline state; after the operation step S3 was performed, M1 was in the crystalline state and M2 was in the crystalline state, and therefore the output signal value was 0, which realizes that logic operation P AND Q=1 AND 0-0.

When P=1 and Q=1, it could be obtained that after the operation step S1 was performed, M1 was in the amorphous state and M2 was in the amorphous state; after the operation step S2 was performed, M1 was in the amorphous state and M2 was in the amorphous state; after the operation step S3 was performed, M1 was in the amorphous state and M2 was in the amorphous state, and therefore the output signal value was 0, which realizes that logic operation P AND Q=1 AND 1=1.

(8) P NAND Q: in the operation step S1, 0 and $\overline{P}$ were input to the input terminals of M1 and M2 respectively; in the operation step S2, x and $\overline{Q}$ were input to the input terminals of M1 and M2 respectively; in the operation step S3, x and x were respectively input to the input terminals of M1 and M2.

When P=0 and Q=0, it could be obtained that after the operation step S1 was performed, M1 was in the amorphous state and M2 was in the amorphous state; after the operation step S2 was performed, M1 was in the amorphous state and M2 was in the amorphous state; after the operation step S3 was performed, M1 was in the amorphous state and M2 was in the amorphous state, and therefore the output signal value was 1, which realizes that logic operation P NAND Q=0 NAND 0=1.

When P=0 and Q=1, it could be obtained that after the operation step S1 was performed, M1 was in the amorphous state and M2 was in the amorphous state; after the operation step S2 was performed, M1 was in the amorphous state and M2 was in the amorphous state; after the operation step S3 was performed, M1 was in the amorphous state and M2 was in the amorphous state, and therefore the output signal value was 1, which realizes that logic operation P NAND Q=0 NAND 1=1.

When P=1 and Q=0, it could be obtained that after the operation step S1 was performed, M1 was in the amorphous state and M2 was in the crystalline state; after the operation step S2 was performed, M1 was in the amorphous state and M2 was in the amorphous state; after the operation step S3 was performed, M1 was in the amorphous state and M2 was in the amorphous state, and therefore the output signal value was 1, which realizes that logic operation P NAND Q=1 NAND 0=1.

When P=1 and Q=1, it could be obtained that after the operation step S1 was performed, M1 was in the amorphous state and M2 was in the crystalline state; after the operation step S2 was performed, M1 was in the amorphous state and M2 was in the crystalline state; after the operation step S3 was performed, M1 was in the amorphous state and M2 was in the amorphous state, and therefore the output signal value was 0, which realizes that logic operation P AND Q=1 AND 0=0.

(9) P OR Q: in the operation step S1, 0 and P were input to the input terminals of M1 and M2 respectively: in the operation step S2, x and Q were input to the input terminals of M1 and M2 respectively; in the operation step S3, x and x were respectively input to the input terminals of M1 and M2.

When P=0 and Q=0, it could be obtained that after the operation step S1 was performed, M1 was in the amorphous state and M2 was in the crystalline state; after the operation step S2 was performed, M1 was in the amorphous state and M2 was in the crystalline state; after the operation step S3 was performed, M1 was in the amorphous state and M2 was in the crystalline state, and therefore the output signal value was 0, which realizes that logic operation P OR Q=0 OR 0-0.

When P=0 and Q=1, it could be obtained that after the operation step S1 was performed, M1 was in the amorphous state and M2 was in the crystalline state; after the operation step S2 was performed, M1 was in the amorphous state and M2 was in the amorphous state; after the operation step S3 was performed, M1 was in the amorphous state and M2 was in the amorphous state, and therefore the output signal value was 1, which realizes that logic operation P OR Q=0 OR 1=1.

When P=1 and Q=0, it could be obtained that after the operation step S1 was performed, M1 was in the amorphous state and M2 was in the amorphous state; after the operation step S2 was performed, M1 was in the amorphous state and M2 was in the amorphous state; after the operation step S3 was performed, M1 was in the amorphous state and M2 was in the amorphous state, and therefore the output signal value was 1, which realizes that logic operation P OR Q=1 OR 0=1.

When P=1 and Q=1, it could be obtained that after the operation step S1 was performed, M1 was in the amorphous state and M2 was in the amorphous state; after the operation step S2 was performed, M1 was in the amorphous state and M2 was in the amorphous state; after the operation step S3 was performed, M1 was in the amorphous state and M2 was in the amorphous state, and therefore the output signal value was 1, which realizes that logic operation P OR Q=1 OR 1=1.

(10) P NOR Q: in the operation step S1, 0 and $\overline{Q}$ were input to the input terminals of M1 and M2 respectively; in the operation step S2, $\overline{P}$ and x were input to the input terminals of M1 and M2 respectively; in the operation step S3, x and x were respectively input to the input terminals of M1 and M2.

When P=0 and Q=0, it could be obtained that after the operation step S1 was performed, M1 was in the amorphous state and M2 was in the amorphous state; after the operation step S2 was performed, M1 was in the amorphous state and M2 was in the amorphous state; after the operation step S3 was performed, M1 was in the amorphous state and M2 was in the amorphous state, and therefore the output signal value was 1, which realizes that logic operation P NOR Q=0 NOR 0=1.

When P=0 and Q=1, it could be obtained that after the operation step S1 was performed, M1 was in the amorphous state and M2 was in the crystalline state; after the operation step S2 was performed, M1 was in the amorphous state and M2 was in the crystalline state; after the operation step S3 was performed, M1 was in the amorphous state and M2 was in the crystalline state, and therefore the output signal value was 0, which realizes that logic operation P NOR Q=0 NOR 1=0.

When P=1 and Q=0, it could be obtained that after the operation step S1 was performed, M1 was in the amorphous state and M2 was in the amorphous state; after the operation step S2 was performed. M1 was in the amorphous state and M2 was in the crystalline state; after the operation step S3 was performed, M1 was in the amorphous state and M2 was in the crystalline state, and therefore the output signal value was 0, which realizes that logic operation P NOR Q=1 NOR 0=0.

When P=1 and Q=1, it could be obtained that after the operation step S1 was performed, M1 was in the amorphous state and M2 was in the crystalline state; after the operation step S2 was performed, M1 was in the crystalline state and M2 was in the crystalline state; after the operation step S3 was performed, M1 was in the crystalline state and M2 was in the crystalline state, and therefore the output signal value was 0, which realizes that logic operation P NOR Q=1 NOR 1=0.

(11) P IMP Q: in the operation step S1, 0 and $\overline{P}$ were input to the input terminals of M1 and M2 respectively; in the operation step S2, x and Q were input to the input terminals of M1 and M2 respectively: in the operation step S3, x and x were respectively input to the input terminals of M1 and M2.

When P=0 and Q=0, it could be obtained that after the operation step S1 was performed, M1 was in the amorphous state and M2 was in the amorphous state; after the operation step S2 was performed, M1 was in the amorphous state and M2 was in the amorphous state; after the operation step S3 was performed, M1 was in the amorphous state and M2 was in the amorphous state, and therefore the output signal value was 1, which realizes that logic operation P IMP Q=0 IMP 0=1.

When P=0 and Q=1, it could be obtained that after the operation step S1 was performed, M1 was in the amorphous state and M2 was in the amorphous state; after the operation step S2 was performed, M1 was in the amorphous state and M2 was in the amorphous state; after the operation step S3 was performed, M1 was in the amorphous state and M2 was in the amorphous state, and therefore the output signal value was 1, which realizes that logic operation P IMP Q=0 IMP 1=1.

When P=1 and Q=0, it could be obtained that after the operation step S1 was performed, M1 was in the amorphous state and M2 was in the amorphous state; after the operation step S2 was performed. M1 was in the amorphous state and M2 was in the crystalline state; after the operation step S3 was performed, M1 was in the amorphous state and M2 was in the crystalline state, and therefore the output signal value was 0, which realizes that logic operation P IMP Q=1 IMP 0=0.

When P=1 and Q=1, it could be obtained that after the operation step S1 was performed, M1 was in the amorphous state and M2 was in the amorphous state; after the operation step S2 was performed, M1 was in the amorphous state and M2 was in the amorphous state; after the operation step S3 was performed, M1 was in the amorphous state and M2 was in the amorphous state, and therefore the output signal value was 1, which realizes that logic operation P IMP Q=1 IMP 1=1.

(12) P NIMP Q: in the operation step S1, 0 and $\overline{Q}$ were input to the input terminals of M1 and M2 respectively; in the operation step S2, P and x were input to the input terminals of M1 and M2 respectively; in the operation step S3, x and x were respectively input to the input terminals of M1 and M2.

When P=0 and Q=0, it could be obtained that after the operation step S1 was performed, M1 was in the amorphous state and M2 was in the amorphous state; after the operation step S2 was performed, M1 was in the crystalline state and M2 was in the amorphous state; after the operation step S3 was performed, M1 was in the crystalline state and M2 was in the amorphous state, and therefore the output signal value was 0, which realizes that logic operation P NIMP Q=0 NIMP 0=0.

When P=0 and Q=1, it could be obtained that after the operation step S1 was performed, M1 was in the amorphous state and M2 was in the crystalline state; after the operation step S2 was performed, M1 was in the crystalline state and M2 was in the crystalline state; after the operation step S3 was performed, M1 was in the crystalline state and M2 was in the amorphous state, and therefore the output signal value was 0, which realizes that logic operation P NIMP Q=0 NIMP 1=0.

When P=1 and Q=0, it could be obtained that after the operation step S1 was performed, M1 was in the amorphous state and M2 was in the amorphous state; after the operation step S2 was performed, M1 was in the amorphous state and M2 was in the amorphous state; after the operation step S3 was performed, M1 was in the amorphous state and M2 was in the amorphous state, and therefore the output signal value was 1, which realizes that logic operation P NIMP Q=1 NIMP 0=1.

When P=1 and Q=1, it could be obtained that after the operation step S1 was performed. M1 was in the amorphous state and M2 was in the amorphous state: after the operation step S2 was performed, M1 was in the amorphous state and M2 was in the crystalline state; after the operation step S3 was performed, M1 was in the amorphous state and M2 was in the crystalline state, and therefore the output signal value was 0, which realizes that logic operation P NIMP Q=1 NIMP 1=0.

(13) P RIMP Q: in the operation step S1, 0 and P were input to the input terminals of M1 and M2 respectively; in the operation step S2, x and $\overline{Q}$ were input to the input terminals of M1 and M2 respectively; in the operation step S3, x and x were respectively input to the input terminals of M1 and M2.

When P=0 and Q=0, it could be obtained that after the operation step S1 was performed, M1 was in the amorphous state and M2 was in the amorphous state; after the operation step S2 was performed, M1 was in the amorphous state and M2 was in the amorphous state; after the operation step S3 was performed, M1 was in the amorphous state and M2 was in the amorphous state, and therefore the output signal value was 1, which realizes that logic operation P RIMP Q=0 RIMP 0=1.

When P=0 and Q=1, it could be obtained that after the operation step S1 was performed, M1 was in the amorphous state and M2 was in the crystalline state; after the operation step S2 was performed, M1 was in the amorphous state and M2 was in the crystalline state; after the operation step S3 was performed, M1 was in the amorphous state and M2 was in the amorphous state, and therefore the output signal value was 0, which realizes that logic operation P RIMP Q=0 RIMP 1=0.

When P=1 and Q=0, it could be obtained that after the operation step S1 was performed, M1 was in the amorphous state and M2 was in the amorphous state; after the operation step S2 was performed, M1 was in the amorphous state and M2 was in the amorphous state; after the operation step S3 was performed, M1 was in the amorphous state and M2 was in the amorphous state, and therefore the output signal value was 1, which realizes that logic operation P RIMP Q=1 RIMP 0=1.

When P=1 and Q=1, it could be obtained that after the operation step S1 was performed. M1 was in the amorphous state and M2 was in the amorphous state; after the operation step S2 was performed, M1 was in the amorphous state and M2 was in the amorphous state; after the operation step S3 was performed, M1 was in the amorphous state and M2 was in the amorphous state, and therefore the output signal value was 1, which realizes that logic operation P RIMP Q=1 RIMP 1=1.

(14) P RNIMP Q: in the operation step S1, 0 and Q were input to the input terminals of M1 and M2 respectively; in the operation step S2, P and x were input to the input terminals of M1 and M2 respectively; in the operation step S3, x and x were respectively input to the input terminals of M1 and M2.

When P=0 and Q=0, it could be obtained that after the operation step S1 was performed, M1 was in the amorphous state and M2 was in the crystalline state; after the operation step S2 was performed, M1 was in the amorphous state and M2 was in the crystalline state; after the operation step S3 was performed, M1 was in the amorphous state and M2 was in the crystalline state, and therefore the output signal value was 0, which realizes that logic operation P RNIMP Q=0 RNIMP 0=0.

When P=0 and Q=1, it could be obtained that after the operation step S1 was performed, M1 was in the amorphous state and M2 was in the amorphous state; after the operation step S2 was performed, M1 was in the amorphous state and M2 was in the amorphous state; after the operation step S3 was performed, M1 was in the amorphous state and M2 was in the amorphous state, and therefore the output signal value was 1, which realizes that logic operation P RNIMP Q=0 RNIMP 1=1.

When P=1 and Q=0, it could be obtained that after the operation step S1 was performed. M1 was in the amorphous state and M2 was in the crystalline state; after the operation step S2 was performed, M1 was in the crystalline state and M2 was in the crystalline state; after the operation step S3 was performed, M1 was in the crystalline state and M2 was in the crystalline state, and therefore the output signal value was 0, which realizes that logic operation P RNIMP Q=1 RNIMP 0=0.

When P=1 and Q=1, it could be obtained that after the operation step S1 was performed, M1 was in the amorphous state and M2 was in the amorphous state; after the operation step S2 was performed, M1 was in the crystalline state and M2 was in the amorphous state; after the operation step S3 was performed, M1 was in the crystalline state and M2 was in the amorphous state, and therefore the output signal value was 0, which realizes that logic operation P RNIMP Q=1 RNIMP 1=0.

(15) P XOR Q: in the operation step S1, P and P were input to the input terminals of M1 and M2 respectively: in the operation step S2, x and Q were input to the input terminals of M1 and M2 respectively: in the operation step S3, Q and x were respectively input to the input terminals of M1 and M2.

When P=0 and Q=0, it could be obtained that after the operation step S1 was performed, M1 was in the amorphous state and M2 was in the crystalline state; after the operation step S2 was performed, M1 was in the amorphous state and M2 was in the crystalline state; after the operation step S3 was performed, M1 was in the amorphous state and M2 was in the crystalline state, and therefore the output signal value was 0, which realizes that logic operation P XOR Q=0 XOR 0=0.

When P=0 and Q=1, it could be obtained that after the operation step S1 was performed. M1 was in the amorphous state and M2 was in the crystalline state; after the operation step S2 was performed, M1 was in the amorphous state and M2 was in the amorphous state; after the operation step S3 was performed, M1 was in the amorphous state and M2 was in the amorphous state, and therefore the output signal value was 1, which realizes that logic operation P XOR Q=0 XOR 1=1.

When P=1 and Q=0, it could be obtained that after the operation step S1 was performed. M1 was in the crystalline state and M2 was in the amorphous state; after the operation step S2 was performed, M1 was in the crystalline state and M2 was in the amorphous state; after the operation step S3 was performed, M1 was in the amorphous state and M2 was in the amorphous state, and therefore the output signal value was 1, which realizes that logic operation P XOR Q=1 XOR 0=1.

When P=1 and Q=1, it could be obtained that after the operation step S1 was performed, M1 was in the crystalline state and M2 was in the amorphous state; after the operation step S2 was performed, M1 was in the crystalline state and M2 was in the amorphous state; after the operation step S3 was performed, M1 was in the crystalline state and M2 was in the amorphous state, and therefore the output signal value was 0, which realizes that logic operation P XOR Q=1 XOR 1=0.

(16) P XNOR Q: in the operation step S1, 0 and P were input to the input terminals of M1 and M2 respectively; in the operation step S2, P and Q were input to the input terminals of M1 and M2 respectively; in the operation step S3, Q and P were respectively input to the input terminals of M1 and M2.

When P=0 and Q=0, it could be obtained that after the operation step S1 was performed, M1 was in the amorphous state and M2 was in the amorphous state; after the operation step S2 was performed, M1 was in the crystalline state and M2 was in the amorphous state; after the operation step S3 was performed, M1 was in the amorphous state and M2 was in the amorphous state, and therefore the output signal value was 1, which realizes that logic operation P XNOR Q=0 XNOR 0=1.

When P=0 and Q=1, it could be obtained that after the operation step S1 was performed. M1 was in the amorphous state and M2 was in the amorphous state; after the operation step S2 was performed, M1 was in the crystalline state and M2 was in the amorphous state; after the operation step S3 was performed, M1 was in the crystalline state and M2 was in the amorphous state, and therefore the output signal value was 0, which realizes that logic operation P XNOR Q=0 XNOR 1=0.

When P=1 and Q=0, it could be obtained that after the operation step S1 was performed, M1 was in the amorphous state and M2 was in the crystalline state; after the operation step S2 was performed, M1 was in the amorphous state and M2 was in the crystalline state; after the operation step S3 was performed, M1 was in the amorphous state and M2 was in the crystalline state, and therefore the output signal value was 0, which realizes that logic operation P XNOR Q=1 XNOR 0=0.

When P=1 and Q=1, it could be obtained that after the operation step S1 was performed, M1 was in the amorphous state and M2 was in the crystalline state; after the operation step S2 was performed, M1 was in the amorphous state and M2 was in the amorphous state; after the operation step S3 was performed, M1 was in the amorphous state and M2 was in the amorphous state, and therefore the output signal value was 1, which realizes that logic operation P XNOR Q=1 XNOR 1=1.

The above examples are only used to illustrate the present disclosure. The structural parameters, materials, manufacturing processes and logic operation parameters of each component can be changed. Any equivalent transformations and improvements made based on the present disclosure should not be excluded from the scope to be protected by the present disclosure.

It is easy for those skilled in the art to understand that the above descriptions are only preferred embodiments of the present disclosure and are not intended to limit the present disclosure. Any modifications, equivalent substitutions and improvements, etc., made within the spirit and principles of the present disclosure should be included in the scope to be protected by the present disclosure.

What is claimed is:

1. A Y-branch phase-change all-optical Boolean logic device comprising:
   a Y-branch waveguide and two phase-change function units;
   wherein each of two Y branches of the Y-branch waveguide has one protruding ridge; each of the two phase-change function units respectively cover the one protruding ridge; based on an evanescent wave coupling effect, when an optical pulse signal having a high power is input into the Y-branch waveguide, each of the two phase-change function units absorbs a part of optical power and produces a crystallization phase change or an amorphization phase change to realize a write operation; reading of a crystallization state of each of the two phase-change function units is achieved through different transmittances that the two phase-change function units have for a detection optical signal in the crystalline state or an amorphous state;
   through write and read operations on the two phase-change function units, the Y-branch phase-change all-optical Boolean logic device realizes all 16 binary Boolean logic operations.

2. The Y-branch phase-change all-optical Boolean logic device according to claim 1, wherein a material of each of the two phase-change function units is a chalcogenide compound being able to generate a reversible crystallization or amorphization phase change under different light pulses.

3. The Y-branch phase-change all-optical Boolean logic device according to claim 1, wherein a real part of a complex refractive index of each of the two phase-change function units is greater than a real part of a complex refractive index of the Y-branch waveguide, so that a part of a light propagating in the Y-branch waveguide enters each of the two phase-change function units to propagate, and then is merged into the Y-branch waveguide to continue propagating; an imaginary part of the complex refractive index of each of the two phase-change function units is not 0, so that each of the two phase-change function units absorbs a light propagated thereby.

4. The Y-branch phase-change all-optical Boolean logic device according to claim 1, wherein the 16 binary Boolean logic operations comprise: a TRUE operation, a FALSE operation, a P operation, a Q operation, a NOT P operation, a NOT Q operation, a P AND Q operation, a P NAND Q operation, a P OR Q operation, a P NOR Q operation, a P IMP Q operation, a P NIMP Q operation, a P RIMP Q operation, a P RIMP Q operation, a P XOR Q operation, and a P XNOR Q operation.

5. The Y-branch phase-change all-optical Boolean logic device according to claim 1, wherein the optical pulse signal is input to a Y branch side where one of the two phase-change function units is located, the one of the two phase-change function units is heated by an optical power absorbed thereby, which is likely to cause a crystallization or an amorphization phase change so that the one of the two phase-change function units is finally in the crystalline state or the amorphous state, such that a write operation is performed on the one of the two phase-change function units.

6. The Y-branch phase-change all-optical Boolean logic device according to claim 1, wherein a detection signal is input to the each of the two Y branches of the Y-branch waveguide, and transmittances of the two phase-change function units are determined by detecting an intensity of an output optical signal and comparing the intensity of the output optical signal with an intensity of the input detection signal, so as to perform a read operation on the two phase-change function units; the detection signal is a light pulse or a continuous light with a low power that does not change a state of each of the two phase-change function units.

7. The Y-branch phase-change all-optical Boolean logic device according to claim 1, wherein the each of the two phase-change function units comprises: a phase-change function unit layer and a protective layer disposed from the bottom to the top; the protective layer is disposed to prevent each of the two phase-change function units from being oxidized.

8. The Y-branch phase-change all-optical Boolean logic device according to claim 3, wherein the real part of the complex refractive index of each of the two phase-change function units is greater than the real part of the complex refractive index of the Y-branch waveguide and the imaginary part of the complex refractive index of each of the two phase-change function units is not 0, wherein the complex refractive index refers to a complex refractive index of each of the two phase-change function units and the Y-branch waveguide at two signal wavelengths, namely the optical pulse signal and the detection signal.

9. An all-binary logic implementation method for the Y-branch phase-change all-optical Boolean logic device according to claim 1, comprising:
when a preset detection signal detects that both the two phase-change function units are in the amorphous state, the detection signal outputs a logic value of 1 after reading the two phase-change function units, in other cases, the output logic value is 0;
a three-step operation is preset to input corresponding logic values to the two phase-change function units respectively; 16 operating modes of a binary Boolean logic operation are preset and combined with the three-step operation to input logic values to the two phase-change function units respectively, and then a detection light signal is input to the two Y branches respectively to read the state of the two phase-change function units by detecting the intensity of the output light signal and comparing the intensity of the output light signal with the intensity of the input detection signal, and a result of the Boolean logic operation is obtained, thus realizing a full-binary Boolean logic operation; wherein inputting the logic values to the two phase-change function units refers to inputting corresponding optical pulse signals to the two phase-change function units using the three-step operation.

\* \* \* \* \*